(12) United States Patent
Goebl et al.

(10) Patent No.: US 7,638,872 B2
(45) Date of Patent: Dec. 29, 2009

(54) POWER SEMICONDUCTOR MODULE

(75) Inventors: Christian Goebl, Nuremberg (DE);
Karlheinz Augustin, Fuerth (DE)

(73) Assignee: Semikron Elektronik GmbH & Co. KG, Nürnberg (DE)

( * ) Notice: Subject to any disclaimer, the term of this patent is extended or adjusted under 35 U.S.C. 154(b) by 188 days.

(21) Appl. No.: 11/595,082

(22) Filed: Nov. 9, 2006

(65) Prior Publication Data

US 2007/0102796 A1     May 10, 2007

(30) Foreign Application Priority Data

Nov. 9, 2005     (DE) ........................ 10 2005 053 398

(51) Int. Cl.
*H01L 23/48* (2006.01)
(52) U.S. Cl. ........................ 257/693; 257/692; 257/694; 257/758; 257/781; 257/784; 257/786
(58) Field of Classification Search ................ 257/779, 257/780, 781, 784, 786, 774, 750, 758, 734, 257/759, 703, 760, E23.175, E21.575, E23.142, 257/E23.151, E23.145, E23.001, 678, 690, 257/691, 692, 693, 694
See application file for complete search history.

(56) References Cited

U.S. PATENT DOCUMENTS

2002/0121688 A1 * 9/2002 Kinsman et al. ............ 257/690

FOREIGN PATENT DOCUMENTS

DE             103 55 925         6/2005

* cited by examiner

*Primary Examiner*—Thao X Le
*Assistant Examiner*—Thanh Y Tran
(74) *Attorney, Agent, or Firm*—Cohen Pontani Lieberman & Pavane LLP

(57) ABSTRACT

A power semiconductor module is presented. The power semiconductor module has a substrate, a composite film, and a power semiconductor component between the substrate and the composite film. The composite film has a thin circuit-structured logic metal layer and a thick circuit-structured power metal layer and between them a thin electrically insulating plastic film. The composite film includes contact nubs, which provide bonding to the power semiconductor component. Feedthrough holes are provided between the logic metal layer and the power metal layer. The plastic film in the region of the respective through-plated hole includes a recess in a region that is free of the logic metal layer. A segment of a flexible thin wire extends through the free region of the logic metal layer and through the recess in the plastic film and is bonded to the logic metal layer and the power metal layer by means of bonding sites.

10 Claims, 1 Drawing Sheet

POWER SEMICONDUCTOR MODULE

BACKGROUND OF THE INVENTION

1. Field of the Invention

The invention relates to a power semiconductor module, having a substrate, a composite film, and at least one power semiconductor component between the substrate and the composite film, which power semiconductor component has a thin circuit-structured logic metal layer and compared to it a thick circuit-structured power metal layer and between them a thin electrically insulating plastic film, the composite film being embodied with contact nubs for bonding to the at least one power semiconductor component, and through-plated holes are provided between the logic metal layer and the power metal layer.

2. Description of the Related Art

One such power semiconductor module is known from German Patent Disclosure DE 103 55 925 A1 filed by the present Applicant. In this known power semiconductor module, the through-plated holes are produced for instance by laser drilling and ensuing laser-supported filling with a conductive material. Through-plated holes with a diameter of a few hundred micrometers are thus possible. The production of such through-plated holes involves not insignificant effort and expense. Moreover, in the process of filling with conductive material, care must be taken that the filling material be adapted in its material properties, such as its coefficient of thermal expansion, to the materials of the composite film.

SUMMARY OF THE INVENTION

Given these known conditions, it is an object of the invention to create a power semiconductor module of the type defined at the outset, which can be produced simply and economically, and in which the through-plated holes can be produced simply and reliably.

The object is met by a power semiconductor module having a substrate, a composite film, and at least one power semiconductor component between the substrate and the composite film, the composite film having a thin circuit-structured logic metal layer, a comparatively thick circuit-structured power metal layer, and between them a thin electrically insulating plastic film, the composite film being embodied with contact nubs for bonding to the at least one power semiconductor component, and feedthrough holes or through-plated holes are provided between the logic metal layer and the power metal layer, wherein in a region of each through-plated hole, the plastic film is embodied with a recess in a region that is free of the logic metal layer and that a flexible segment of a thin wire extends through the region that is free of the logic metal layer and through the recess in the plastic film and is bonded to the logic metal layer and to the power metal layer by bonding.

In the power semiconductor module of the invention, it is preferred if the circuit structures of the logic metal layer and the circuit structures of the power metal layer are produced in a single operation, that is, simultaneously by etching. This etching operation is performed in a manner known per se. This expediently involves mask etching of the composite film, which can advantageously be done quasi-endlessly continuously.

The logic metal layer of the semiconductor module of the invention is preferably a copper layer, and its power metal layer is preferably an aluminum layer. The plastic film between the logic metal layer and the power metal layer preferably comprises polyimide.

In the composite film of the semiconductor module of the invention, the logic metal layer and the power metal layer are preferably two-dimensionally glued to the plastic film.

Each recess in the plastic film of the composite film of the power semiconductor module of the invention is preferably produced by lasing. For that purpose, a $CO_2$ inscription laser may, for example, be employed.

The thin wire of each through-plated hole preferably comprises aluminum having, for example, a diameter of 25-100 $\mu m$. The bonded connection of the thin wire to the thin circuit-structured logic metal layer and to the thicker circuit-structured power metal layer is expediently done with a standard thin-wire bonder.

The power semiconductor module of the invention has the advantage that each through-plated hole is very flexible and reliable. The thin wire for connecting the logic metal layer and the power metal layer has a flexibility which takes the flexibility of the logic metal layer and the power metal layer into account.

After the bonding of the thin wire to the logic metal layer and the power metal layer, each through-plated hole can be stamped and covered with a suitable insulating material as needed.

Further details, characteristics, and advantages will become apparent from the ensuing description of an exemplary embodiment of the power semiconductor module of the invention, which is shown schematically in the drawing and not to scale.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

DETAILED DESCRIPTION OF THE PRESENTLY PREFERRED EMBODIMENTS

Figure 1:
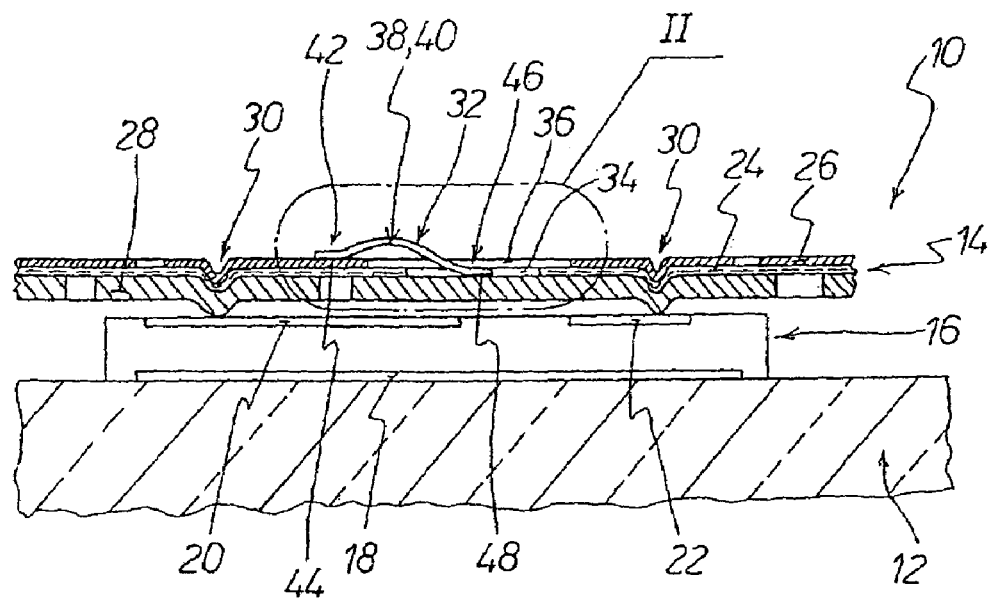
FIG. 1, in an enlarged sectional view, not to scale, showing portions of an embodiment of the power semiconductor module.

FIG. 1 shows some portions in section of an embodiment of the power semiconductor module 10 having a substrate 12, a composite film 14, and a power semiconductor component 16 that is provided between the substrate 12 and the composite film 14. The power semiconductor component 16 has a collector 18, an emitter 20, and a gate 22.

The composite film has a thin electrically insulating plastic film 24 provided on a first main face with a thin circuit-structured logic metal layer 26 and on a second main face opposing the first main face with a circuit-structured power metal layer 28.

The composite film 14 is embodied with nubs 30, which serve the purpose of bonding to the power semiconductor component 16.

Between the thin circuit-structured logic metal layer 26 and the circuit-structured power metal layer 28, feedthrough holes or through-plated holes 32 are provided, of which in FIG. 1 only one through-plated hole 32 is shown. As can be seen clearly from FIG. 2, the electrically insulating plastic film 24 is embodied with a recess 34 in the region of each through-plated hole 32. The recess 34 is embodied in the region 36 that because of its structuring is free of the logic metal layer 26, or in other words under this region.

A flexible segment 38 of a thin wire 40 is firmly bonded by its end portion 42 to the circuit-structured logic metal layer 26. This is indicated by reference numeral 44. The second end portion 46, remote from it, of the thin wire 40 is firmly bonded to the circuit-structured power metal layer 28. This bonding site is identified by reference numeral 48.

Figure 2:
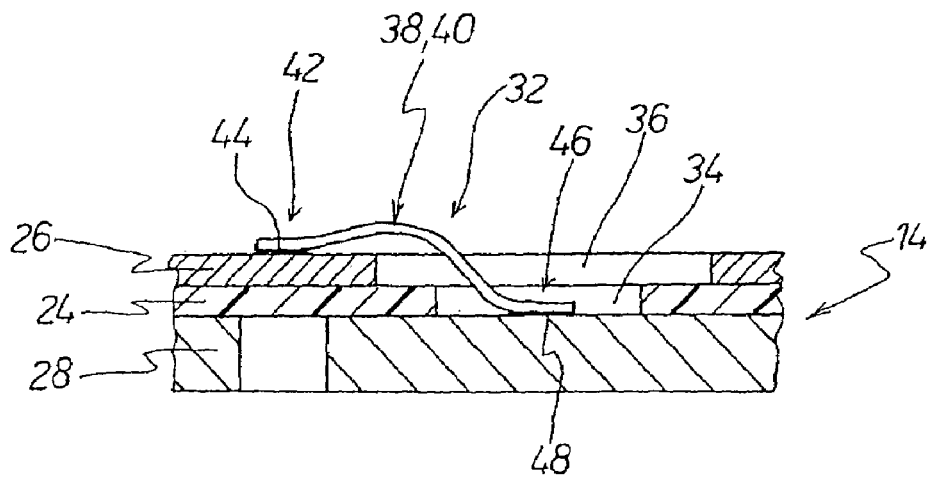
FIG. 2 shows a further-enlarged sectional view of the detail marked II in FIG. 1.

In FIGS. 1 and 2, identical details are identified by the same reference numerals, so there is no need to describe all the details again in conjunction with FIGS. 1 and 2.

Thus, while there have shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps, which perform substantially the same function in substantially the same way to achieve the same results, are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. A power semiconductor module, comprising:
    a substrate;
    at least one power semiconductor component on the substrate; and
    a composite film arranged on the at least one power semiconductor component such that the at least one power semiconductor component is between the substrate and the composite film,
    wherein the composite film has a thin circuit-structured logic metal layer, a comparatively thick circuit-structured power metal layer, and a thin electrically insulating film disposed between the circuit-structured logic metal layer and the circuit-structured power metal layer, the composite film having contact nubs for bonding to the at least one power semiconductor component,
    wherein feedthrough holes are provided between the logic metal layer and the power metal layer, the electrically insulating film defining a recess in the region of each feedthrough hole that is free of the logic metal layer, and
    wherein a flexible segment of a thin wire extends through the region that is free of the logic metal layer and through the recess in the electrically insulating film and is bonded to bonding sites at each of the logic metal layer and the power metal layer.

2. The power semiconductor module of claim 1, wherein the circuit structures of the logic metal layer and of the power metal layer are produced simultaneously by etching.

3. The power semiconductor module of claim 1, wherein the logic metal layer is a copper layer and the power metal layer is an aluminum layer.

4. The power semiconductor module of claim 1, wherein the electrically insulating film comprises polyimide.

5. The power semiconductor module of claim 1, wherein the logic metal layer and the power metal layer are adhered two-dimensionally to the electrically insulating film.

6. The power semiconductor module of claim 1, wherein each recess in the electrically insulating film is produced by lasing.

7. The power semiconductor module of claim 1, wherein the thin wire comprises aluminum.

8. The power semiconductor module of claim 1, wherein the thin wire has a diameter of 25-100 μm.

9. The power semiconductor module according to claim 1, wherein the feedthrough hole is covered with an insulating material.

10. The power semiconductor module of claim 1, wherein said feedthrough holes are stamped and covered with an insulating material.

* * * * *